United States Patent
Park et al.

(10) Patent No.: US 6,337,291 B1
(45) Date of Patent: Jan. 8, 2002

(54) METHOD OF FORMING CAPACITOR FOR SEMICONDUCTOR MEMORY DEVICE

(75) Inventors: Dong Su Park; Tae Hyeok Lee, both of Kyoungki-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/607,976

(22) Filed: Jun. 30, 2000

(30) Foreign Application Priority Data

Jul. 1, 1999 (KR) .................................. 99-26393

(51) Int. Cl.$^7$ .................................. H01L 21/469
(52) U.S. Cl. .................. 438/785; 438/253; 438/254; 438/255; 438/256; 438/396; 438/397; 438/398; 438/399
(58) Field of Search .................. 438/785, 253–256, 438/396–399

(56) References Cited

U.S. PATENT DOCUMENTS

| | | |
|---|---|---|
| 4,130,694 A | 12/1978 | Glass et al. |
| 5,455,204 A | * 10/1995 | Dobuzinsky et al. ........ 438/238 |
| 5,631,188 A | 5/1997 | Chang et al. |
| 5,741,721 A | 4/1998 | Stevens |
| 5,753,945 A | 5/1998 | Chivukula et al. |
| 5,763,300 A | 6/1998 | Park et al. |
| 5,776,660 A | 7/1998 | Hakey et al. |
| 5,837,576 A | 11/1998 | Chen et al. |
| 5,859,760 A | 1/1999 | Park et al. |
| 5,872,415 A | 2/1999 | Dreifus et al. |
| 5,910,880 A | 6/1999 | DeBoer et al. |
| 5,936,831 A | 8/1999 | Kola et al. |
| 5,977,582 A | 11/1999 | Fleming et al. |
| 5,980,977 A | 11/1999 | Deng et al. |
| 6,204,203 B1 | * 3/2001 | Narwankar et al. ......... 438/785 |
| 6,228,760 B1 | * 5/2001 | Yu et al. ...................... 438/636 |

FOREIGN PATENT DOCUMENTS

| | | |
|---|---|---|
| JP | 63038248 | 2/1988 |
| JP | 62136035 | 6/1989 |
| JP | 01173622 | 7/1989 |
| JP | 02226754 | 9/1990 |
| JP | 05167008 | 7/1993 |
| JP | 05335483 | 12/1993 |
| JP | 06163819 | 6/1994 |
| JP | 07014993 | 1/1995 |
| JP | 07045467 | 2/1995 |
| JP | 11191612 | 7/1999 |
| JP | 11233723 | 8/1999 |

* cited by examiner

*Primary Examiner*—John F. Niebling
*Assistant Examiner*—Jennifer M. Kennedy
(74) *Attorney, Agent, or Firm*—Pillsbury Winthrop LLP

(57) ABSTRACT

Disclosed herein is a method of forming a capacitor for a semiconductor memory device. The method comprises a step of:forming a lower electrode on the semiconductor substrate; forming an $O_3$-oxide film on the lower electrode; forming Si—O—N bonds on the surface of the $O_3$-oxide film; forming a TaON film on the Si—O—N bonds by a chemical vapor deposition of a Ta chemical vapor, an $O_2$ gas and an $NH_3$ gas; and forming an upper electrode on the TaON film.

24 Claims, 5 Drawing Sheets

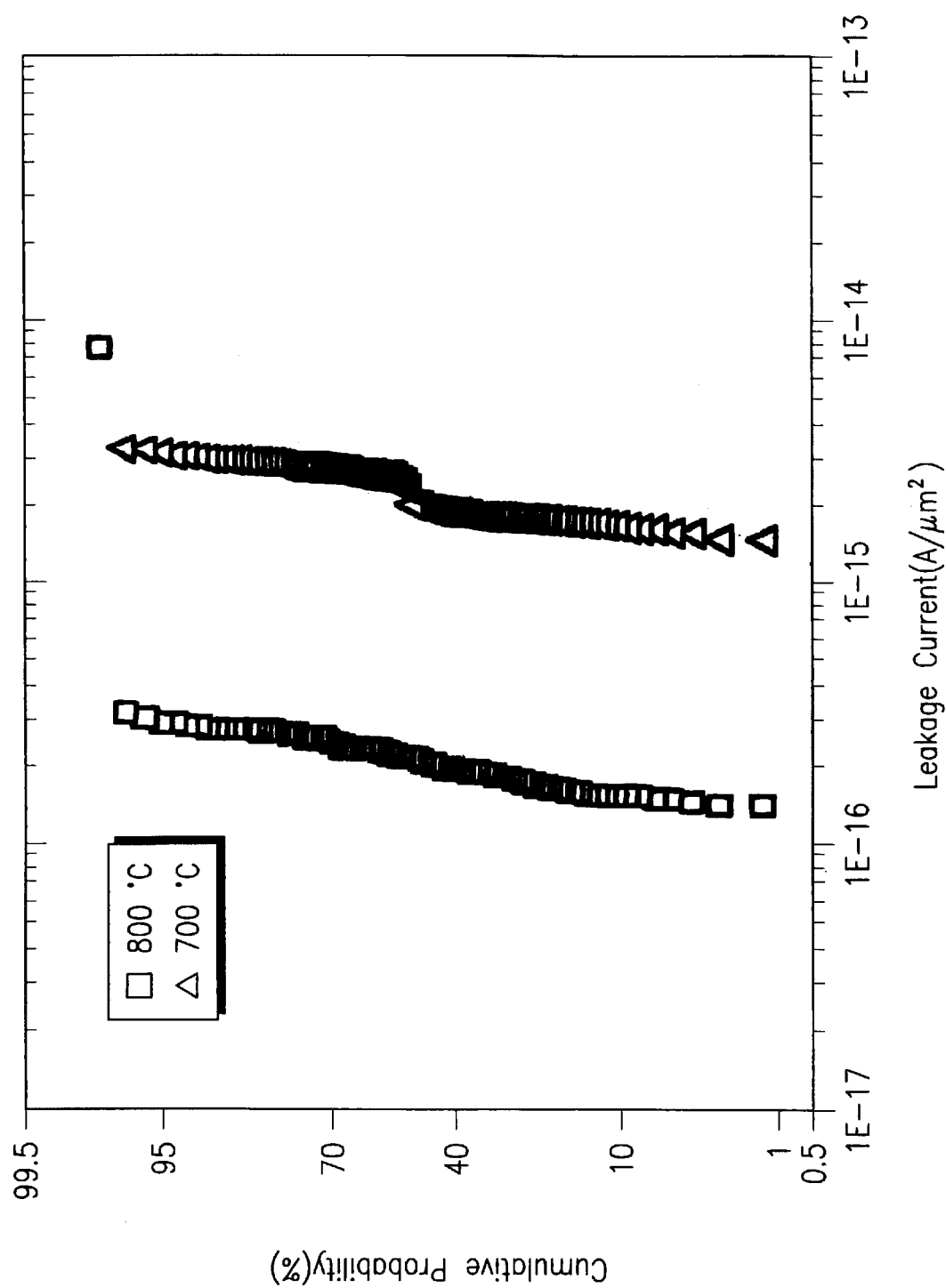

METHOD OF FORMING CAPACITOR FOR SEMICONDUCTOR MEMORY DEVICE

BACKGROUND OF THE INVENTION

1. Field of the Invention

The present invention relates to a method of forming a capacitor for a semiconductor memory device. More particularly, the present invention relates to a method of forming a capacitor having a TaON film as a dielectric film, in a semiconductor memory device.

2. Description of the Prior Art

Along with the recent progress in the semiconductor manufacturing technology, the demand for memory device has increased dramatically. Generally, a memory device having high capacitance is desirable. Capacitance of the capacitor can be increased by using a dielectric layer having high dielectric constant or enlarging the surface area of a lower electrode. Those conventional capacitors are made with a $Ta_2O_5$ layer having a dielectric constant higher than that of nitride-oxide(NO), thereby forming the lower electrode of 3-Dimensional structure.

However, as the $Ta_2O_5$ film has an unstable stoichiometry, it must be subjected to an oxidation process for making it a stable state after being deposited. Upon this oxidation, the $Ta_2O_5$ film is easily reacted with the lower electrode. This results in an increase in thickness of the effective dielectric film, thereby causing a decrease in capacitance of the capacitor. In addition, as the $Ta_2O_5$ film is formed from an organic tantalum metal material as a precursor, there remain a large amount of carbon compounds in the $Ta_2O_5$ film so that leakage current tends to generate.

To solve such drawbacks with the $Ta_2O_5$ film, we have previously proposed a capacitor using a TaON film as a dielectric substance, as described in Korean Patent Application No. 99-24218. Such a capacitor using the TaON film as the dielectric substance is shown in FIG. 1.

Referring to FIG. 1, a gate electrode 13 including a gate insulating layer 12 at a lower portion thereof is formed according to a known technique on the upper part of a semiconductor substrate 10 which a field oxide layer 11 is formed at a selected portion thereof. A junction region 14 is formed on the semiconductor substrate 10 at both sides of the gate electrode 13, thereby forming an MOS transistor. A first interlevel insulating layer 16 and a second interlevel insulating layer 18 are formed on the upper part of the semiconductor substrate 10 in which the MOS transistor is formed. A storage node contact hole h is formed inside the first and the second interlevel insulating layers 16,18 so that a junction region 14 is exposed. A cylinder type lower electrode 20 is formed according to a known method, inside the storage node contact hole h so as to be in contact with the exposed junction region 14. A HSG(hemi-spherical grain) layer 21 is formed on a surface of a lower electrode 20 to increase the surface area of the lower electrode 20 more. The surface of the lower electrode including the HSG layer 21 is thermal annealed at a temperature of 850° C. to 950° C. under a $NH_3$ plasma gas atmosphere for the purpose of preventing a natural oxide from being generated. A silicon nitride film 22 is formed by thermal annealing, on the lower electrode 20 including the HSG film 21 and on the second interlayer insulating film 18. Natural oxidation reaction of the lower electrode 20 is restrained by forming the silicon nitride film 22. On the silicon nitride film 22, there is formed a TaON film 23 by a chemical vapor deposition of tantalum chemical vapor, $NH_3$ gas and $O_2$ gas. Then, the TaON film is crystallized by a thermal annealing, after which an upper electrode 25 is formed on the crystallized TaON film 23. This TaON film 23 has a very high dielectric constant ($\in$=20 to 25), and consists of stable Ta—O—N bonds. For this reason, the TaON film 23 does not need to be subjected to an additional oxidization processing for the conversion into a stable state after being deposited, and also does not result in an increase in its thickness by virtue of its very low oxidation reactivity.

However, as the thermal annealing for the prevention of the natural oxidation film generation, which is carried out before the deposition of the TaON film 23, is proceeded at 800° C. or above, the lower electrode 20 and other electrodes are melted that are made of material having a melting point of 800° C. or below. Thus, it is actually impossible to conduct the thermal processing at 800° C. or above.

Meanwhile, another method was previously proposed in which the thermal annealing before the deposition of the dielectric film is carried out at a temperature of 700° C. or below. However, if the thermal annealing is carried out at 700° C. or below, capacitance of the resulting capacitor can be increased as compared with the case of performing the thermal annealing at 800° C. or above as shown in FIG. 2A, whereas a leakage current characteristic can be deteriorated as shown in FIG. 2B.

SUMMARY OF THE INVENTION

Accordingly, it is the object of the present invention to provide a method of manufacturing a capacitor for semiconductor memory devices capable of occurring less leakage current and obtaining high capacitance.

According to an embodiment of the present invention, there is provided a method of forming a capacitor on a semiconductor substrate, comprising the steps of: forming a lower electrode on the semiconductor substrate; forming an $O_3$-oxide film on the lower electrode; forming Si—O—N bonds on the surface of the $O_3$-oxide film; forming a TaON film on the Si—O—N bonds by a chemical vapor deposition of a Ta chemical vapor, an $O_2$ gas and a $NH_3$ gas; and forming an upper electrode on the TaON film.

According to another embodiment of the present invention, there is provided a method of forming a capacitor on a semiconductor substrate, comprising the steps of: forming a lower electrode on the semiconductor substrate; forming an $O_3$-oxide film on the lower electrode by being supplied with an $O_3$ gas at a temperature of 200° C. to 500° C.; forming Si—O—N bonds on the surface of the $O_3$-oxide film; forming a TaON film on the Si—O—N bonds by a chemical vapor deposition of a Ta chemical vapor, an $O_2$ gas and an $NH_3$ gas at a temperature of 300° C. to 600° C.; thermally processing the TaON film; and forming an upper electrode on the TaON film.

BRIEF DESCRIPTION OF THE DRAWINGS

The above and other objects and aspects of the invention will be apparent from the following description of embodiments with reference to the accompanying drawings, in which:

FIG. 2B is a graph showing leakage current of a capacitor according to a pre-processing temperature of a dielectric film.

DETAILED DESCRIPTION OF THE PREFERRED EMBODIMENTS

Figure 1:
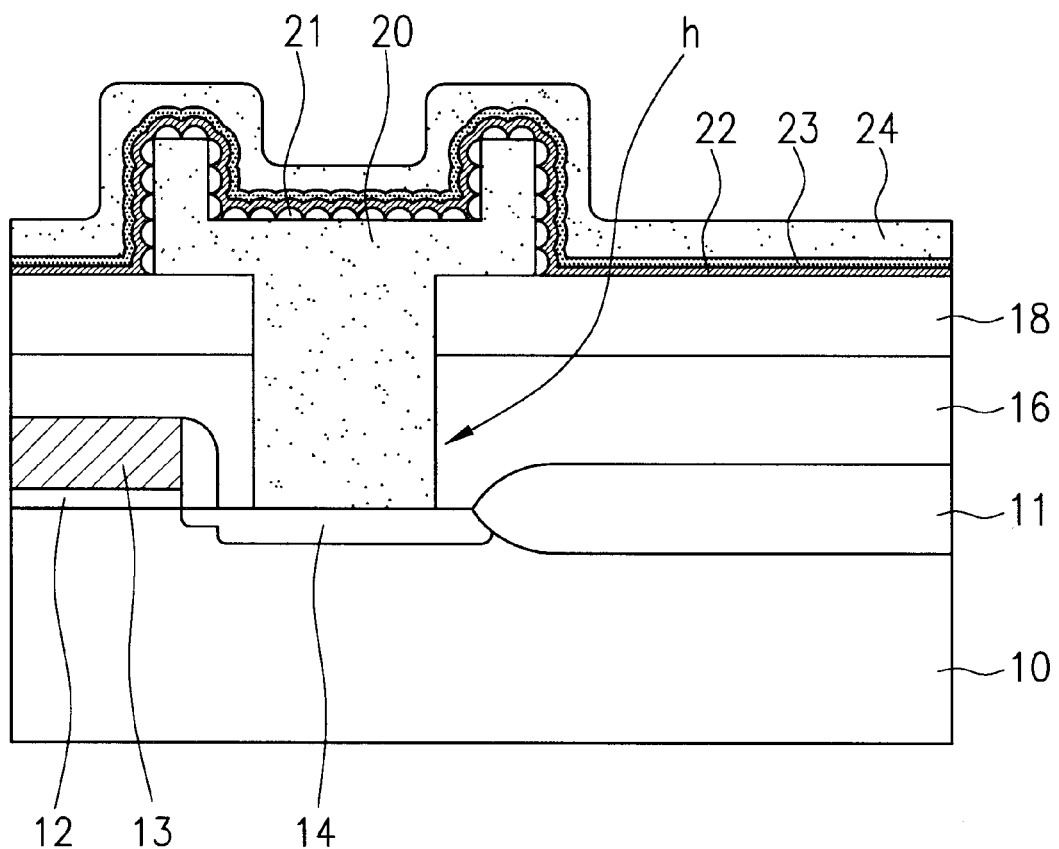
FIG. 1 is a cross-sectional view showing a prior art capacitor in a semiconductor device.
Figure 2A:
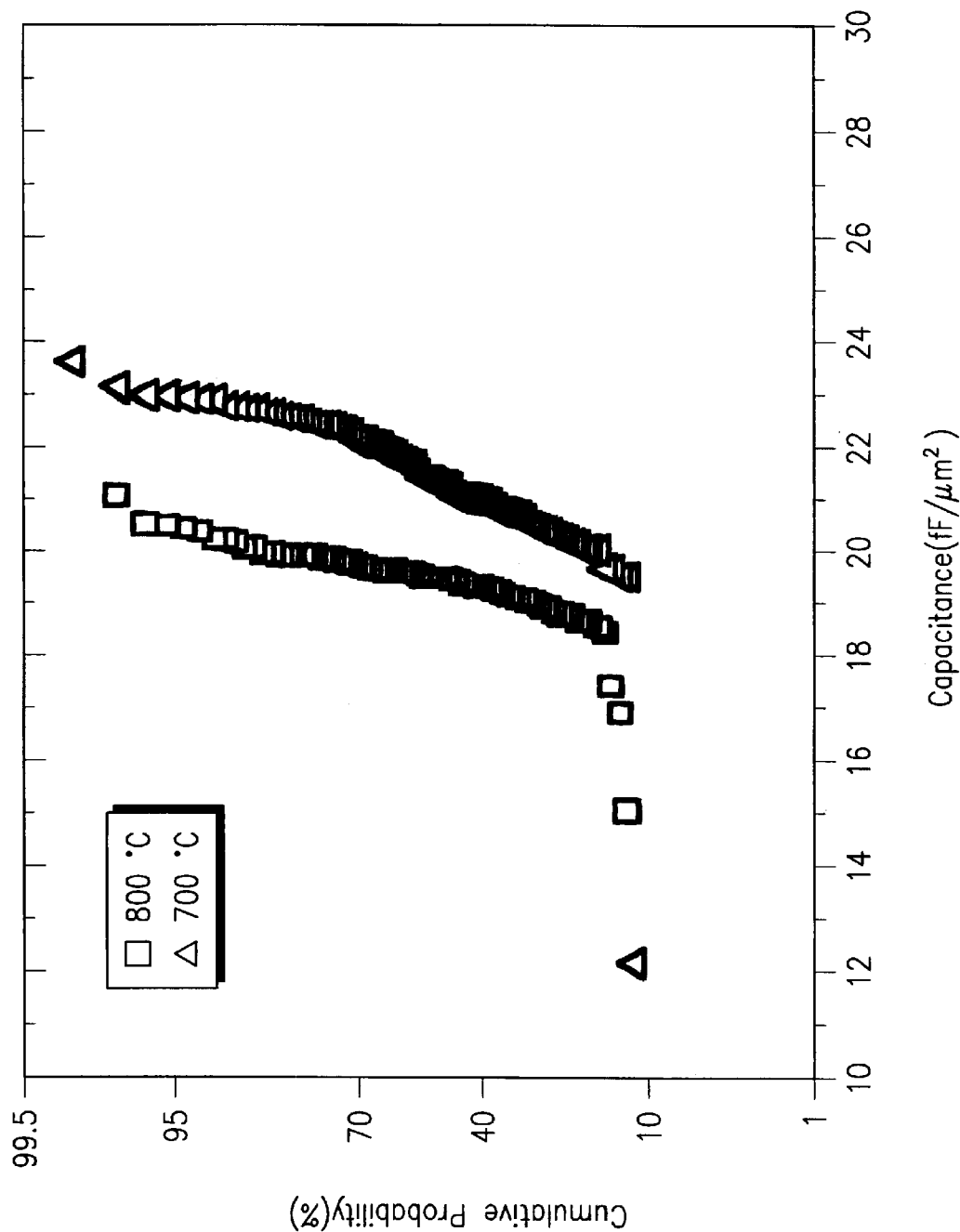
FIG. 2A is a graph showing capacitance of a capacitor according to a pre-processing temperature of a dielectric film.
Figure 3A:
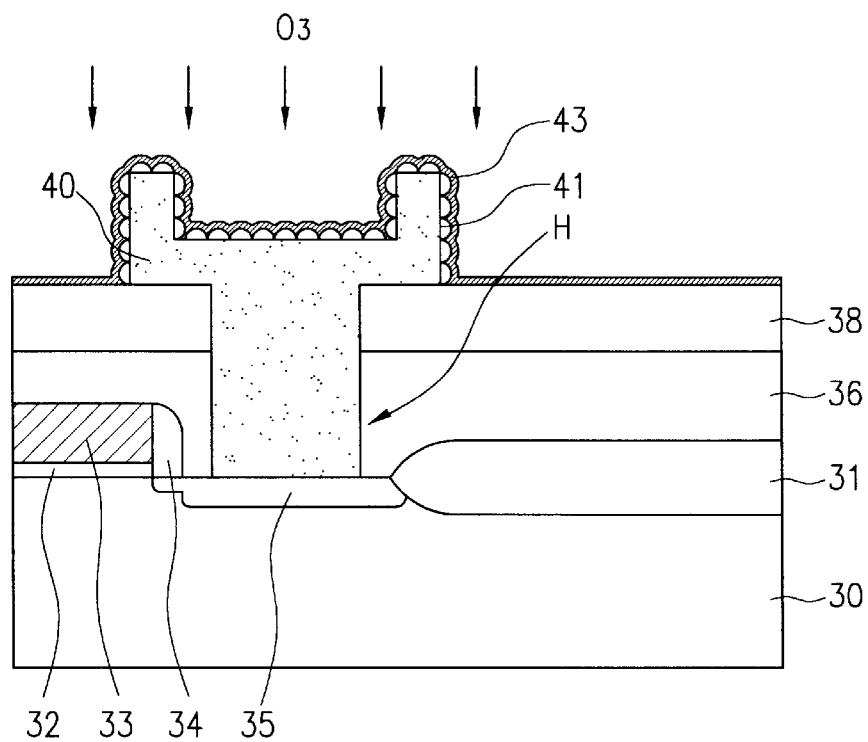
FIGS. 3A to 3D are cross-sectional views for illustrating a method of forming a capacitor in a semiconductor device according to an embodiment of the present invention.

Referring to FIG. 3A, a field oxide layer 21 is formed on a selected portion of a semiconductor substrate having a selected conductivity by a known method. A gate electrode 33 having a gate insulating layer 32 at a lower portion thereof is formed on a selected portion of the semiconductor substrate 30, and a spacer 34 is formed at both side-walls of the gate electrode 33 by a known method. A junction region 35 is formed on a semiconductor substrate 30 of both sides of the gate electrode 33, thereby forming a MOS transistor. A first interlayer insulating layer 36 and a second interlayer layer 38 are formed on the semiconductor substrate 30 in which the MOS transistor is formed. Afterward, the second and the first interlayer insulating layers 38,36 are patterned to expose a selected portion of the junction region 35, thereby forming a storage node contact hole H. A lower electrode 40 is formed to be in contact with the exposed junction region 35. At this time, the lower electrode of the present embodiment is formed as one of the various types such as stack, cylinder, pin and stack-cylinder. A HSG layer 41 is formed on the lower electrode 40 by a known method so that the surface area of the lower electrode 40 is increased. In order to prevent the generation of a low dielectric natural oxide film on an interface between the lower electrode 40 including the HSG film 41 and a subsequently formed dielectric film (not shown), an $O_3$-oxide film 43 is formed on the lower electrode 40 including the HSG film 41 and on the second interlevel insulating film 38. This $O_3$-oxide film 43 is formed to have a thickness of 5 Å to 20 Å by the supply of an $O_3$ gas at a temperature of 200° C. to 500° C. Upon the formation of the $O_3$-oxide film 43, an UV-lamp may be used for the purpose of enhancing reactivity of the $O_3$ gas. In addition, the $O_3$-oxide film is uniformly formed at a low temperature, such as 500° C. or below, while it is excellent in leakage current characteristic as compared with a usual silicon nitride film(SiN).

Figure 3B:
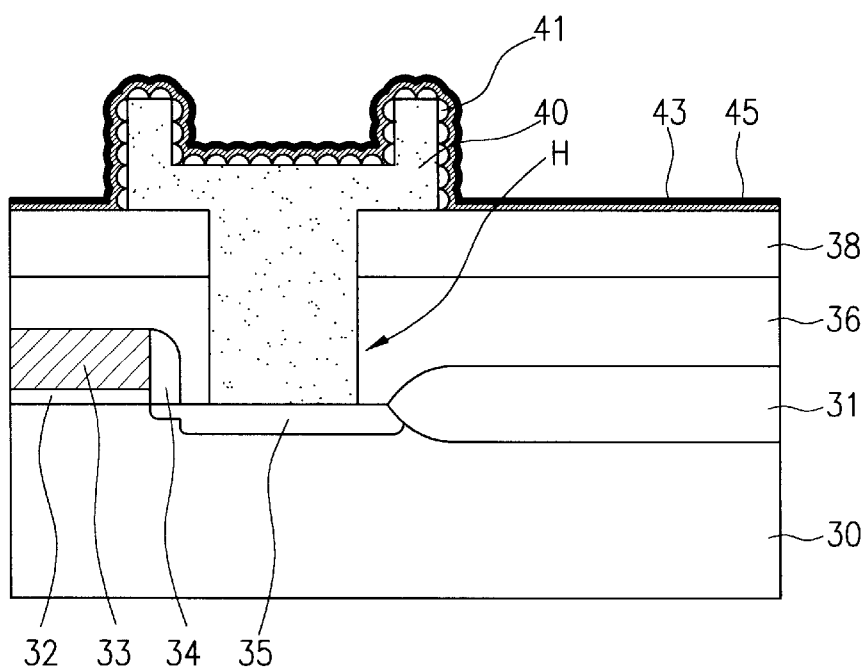

Referring to FIG. 3B, Si—O—N bonds 45 are formed on the $O_3$-oxide film 43. For this, the $O_3$-oxide film 43 is subjected to in situ plasma processing under an $NH_3$ gas atmosphere, thereby forming the Si—O—N bonds 45. Preferably, such in situ plasma processing is performed at a temperature of 300 to 500° C. under a power of 20 to 500 Watts, and the $NH_3$ gas is supplied at a flow rate of 10 to 1,000 SCCM. The Si—O—N bonds 45 serve to prevent oxygen molecules of a subsequently formed dielectric film from diffusing toward the lower electrode 40.

Figure 3C:
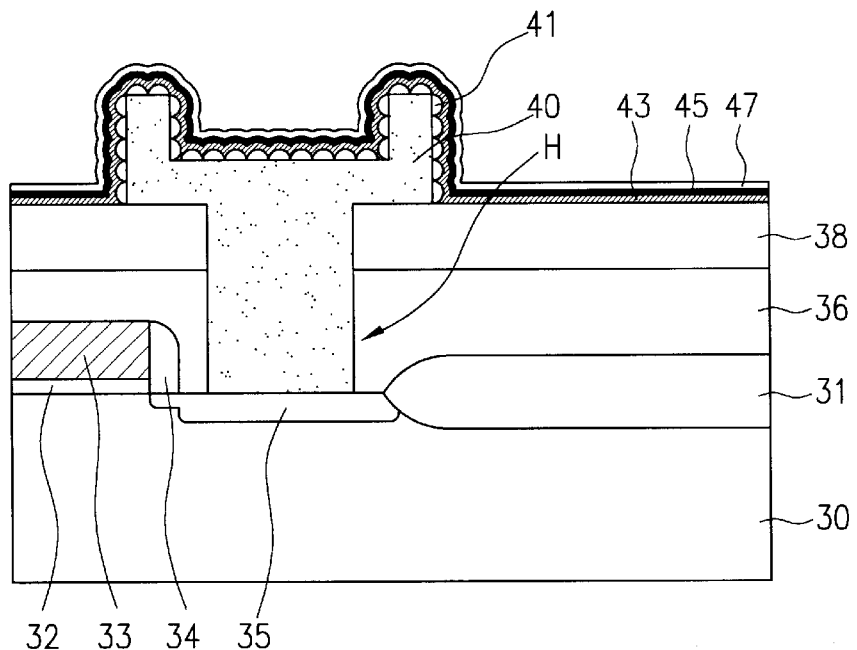

As shown in FIG. 3C, as a dielectric, a amorphous TaON layer 47 is formed on the Si—O—N bonds 45 by a chemical reaction of those gases of Ta chemical vapor evaporated from a precursor like $Ta(OC_2H_5)_5$(tantalum ethylate), $O_2$ gas and $NH_3$. Preferably, the reaction to form the TaON layer 47 is occurred only on the wafer surface under a condition that a gas phase reaction within a chamber is extremely restrained. At this time, the TaON layer 47 is preferably formed by a chemical vapor deposition method, for example the LPCVD method at temperature of about 300~600° C. and 0.1~1.2 Torr. Herein, the precursor like the $Ta(OC_2H_5)_5$ is in liquid state, it should be provided to the LPCVD chamber when its phase is converted into vapor state. That is, a selected amount of the precursor in liquid state is flowed using a flow controller such as MFC(mass flow controller) and then is provided into an evaporizer or an evaporation tube and evaporated at temperature of 150~200° C., thereby generating a Ta chemical vapor. The Ta chemical vapor is provided to the LPCVD chamber maintained at temperature of 300~600° C. The Ta chemical vapor as formed above, $O_2$ gas and $NH_3$ gas react together in the chamber, thereby forming an amorphous TaON layer 47. Herein, $NH_3$ gas is supplied by flux of 10~1000 sccm.

Figure 3D:
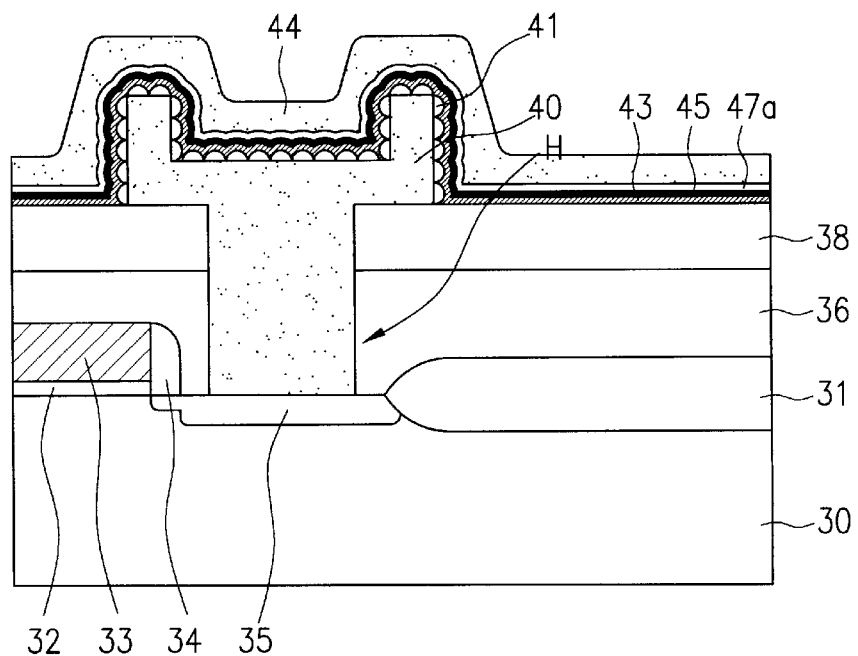

As shown in FIG. 3D, the amorphous TaON film 47 is then subjected to in situ or ex situ plasma thermal annealing at a temperature of 200° C. to 600° C. under an $NH_3$ or $N_2O$ gas atmosphere to improve its characteristics. This thermal annealing eliminates structural defects such as microcracks, pinholes, and the like on the interface of the TaON film 47, and also improves homogeneity of the film 47.

In addition, the TaON film 47 is subjected to a rapid thermal processing or an electric furnace thermal annealing for 30 seconds to 30 minutes at 700° C. or below under a nitrogen or oxygen-containing atmosphere, such as an $NH_3$ gas, $N_2/H_2$ gas, $N_2O$ gas, or $O_2$ gas atmosphere. This thermal annealing converts the amorphous TaON film into a denser crystalline film 47a. As the TaON film, a dielectric substance, can have a high dielectric constant whether in the crystalline state or in the amorphous state, it can apply to the capacitor of the present invention in any of the crystalline and amorphous states. However, this embodiment employs the TaON film 47a of the crystalline state as the dielectric material.

Then, an upper electrode 50 is formed on the TaON film 47a. The formed upper electrode 50 can be a doped polysilicon film, or a metal layer such as TiN, TaN, W, WN, WSi, Ru, $RuO_2$, Ir, $IrO_2$, or Pt. If the doped polysilicon film is used as the upper electrode 50, it is preferably deposited to have a thickness of about 1,000 to 1,500 Å. On the other hand, if the metal layer is used as the upper electrode 50, it is preferably formed to have a thickness of about 100 to 600 Å. In addition, the polysilicon film can be formed by a CVD method, while the metal layer can be formed by any of LPCVD, PECVD, and RF magnetic sputtering methods.

As apparent from the above embodiment, the pre-processing, carried out at a temperature of 200 to 500 ° C. between the step of forming the lower electrode and the step of forming the TaON dielectric film, produces the $O_3$-oxide film excellent in leakage current characteristic. Moreover, to prevent the diffusion of oxygen molecules of the dielectric film, the SiON film consisting of the Si—O—N bonds is formed on the TaON film. Thus, the above embodiment allows the pre-processing to be carried out at a low temperature while providing the $O_3$-oxide film excellent in leakage current characteristic.

Further, the crystallization of the TaON film is also carried out at a low temperature, such as 700° C. or below. This prevents the TaON film from being additionally oxidized, and hence prevents capacitance of the capacitor from being decreased.

Also, the TaON film consists of the stable Ta—O—N film so that it is maintained at a structurally stable state. Additionally, the TaON film is low in reactivity with the upper and lower electrodes, so that the dielectric film can be prevented from being increased in its thickness.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming a capacitor on a semiconductor substrate, comprising the steps of:
   forming a lower electrode on the semiconductor substrate;
   forming an $O_3$-oxide film on the lower electrode;
   forming Si—O—N bonds on the surface of the $O_3$-oxide film;
   forming a TaON film on the Si—O—N bonds by a chemical vapor deposition of a Ta chemical vapor, an $O_2$ gas and an $NH_3$ gas; and
   forming an upper electrode on the TaON film.

2. The method of claim 1, in which the $O_3$ oxide film is formed by a supply of an $O_3$ gas at a temperature of 200° C. to 500° C.

3. The method of claim 1, in which the $O_3$ oxide film is formed to have a thickness of 5 to 20 Å.

4. The method of claim 1, in which the $O_3$ oxide film is formed while being irradiated with light from an UV-lamp.

5. The method of claim 1, in which the Si—O—N bond is formed at a temperature of 300 to 500 ° C.

6. The method of claim 1, in which the Si—O—N bonds are formed by a plasma processing of the $O_3$ oxide film surface under an $NH_3$ gas atmosphere.

7. The method of claim 6, in which the Si—O—N bond is formed by a supply of a $NH_3$ gas at a flow rate of about 10 to 1000 SCCM, and by an application of a power of 20 to 50 watts.

8. The method of claim 1, in which the formation of the TaON film is carried out in a LPCVD chamber, which is maintained at a temperature of 300 to 600 ° C. and a pressure of 0.1 to 1.2 Torr.

9. The method of claim 8, in which the Ta chemical vapor is obtained by vaporizing a tantalum-containing precursor at a temperature of 150 to 200 ° C.

10. The method of claim 8, in which the $O_2$ gas and the $NH_3$ gas are supplied at a flow rate of about 10 SCCM to 1000 SCCM, respectively.

11. The method of claim 1, further comprising a step of: post-processing the TaON film, between the step of forming the TaON film and the step of forming the upper electrode.

12. The method of claim 11, in which the post-processing step of the TaON film is carried out by a plasma thermal annealing of the TaON film at a temperature of 200° C. to 600° C. under an $NH_3$ or $N_2/H_2$ gas atmosphere.

13. The method of claim 11, in which the post-processing step of the TaON film is carried out by a rapid thermal processing or a furnace annealing, for 30 seconds to 30 minutes at less than 700° C. under a gas atmosphere selected from $NH_3$ gas, $N_2/H_2$ gas, $N_2O$ gas, and $O_2$ gas.

14. A method of forming a capacitor on a semiconductor substrate, comprising the steps of:
   forming a lower electrode on the semiconductor substrate;
   forming an $O_3$ oxide film on the lower electrode by supplying $O_3$ gas at a temperature of 200° C. to 500° C.;
   forming Si—O—N bonds on the surface of the $O_3$ oxide film;
   forming a TaON film on the Si—O—N bonds by a chemical vapor deposition of a Ta chemical vapor, an $O_2$ gas and an $NH_3$ gas at a temperature of 300° C. to 600° C.;
   thermally annealing the TaON film; and
   forming an upper electrode on the TaON film.

15. The method of claim 14, in which the $O_3$ oxide film is formed to have a thickness of 5 to 20 Å.

16. The method of claim 14, in which the $O_3$ oxide film is formed while being irradiated with light from an UV-lamp.

17. The method of claim 14, in which the Si—O—N bonds are formed by a plasma processing of the $O_3$ oxide film surface under an $NH_3$ atmosphere.

18. The method of claim 16, in which the Si—O—N bond is formed by a supply of a $NH_3$ gas at a flow rate of about 10 to 1000 SCCM, and by an application of a power of 20 to 500 Watts.

19. The method of claim 14, in which the formation of the TaON film is carried out in a LPCVD chamber and a pressure of 0.1 to 1.2 Torr.

20. The method of claim 19, in which the Ta chemical vapor is obtained by vaporizing a tantalum-containing precursor at a temperature of 150 to 200° C.

21. The method of claim 19, in which the $O_2$ gas and the $NH_3$ gas are supplied at a flow rate of about 10 SCCM to 1000 SCCM, respectively.

22. The method of claim 14, in which the step of thermally processing the TaON film is carried out by a plasma thermal processing of the TaON film at a temperature of 200° C. to 600° C. under an $NH_3$ or $N_2/H_2$ gas atmosphere.

23. The method of claim 14, in which the step of thermally processing the TaON film is carried out by a rapid thermal processing or a furnace annealing, for 30 seconds to 30 minutes at less than 700° C. under a gas atmosphere selected from $NH_3$ gas, $N_2/H_2$ gas, $N_2O$ gas, and $O_2$ gas.

24. A method of forming a capacitor on a semiconductor substrate, comprising, in order, the steps of:
   forming a lower electrode having an upper surface on the semiconductor substrate;
   forming an $O_3$-oxide layer on the upper surface of the lower electrode;
   treating the $O_3$-oxide layer to convert an upper portion of the $O_3$-oxide layer and form a SiON film, a lower portion of the $O_3$-oxide layer remaining unconverted;
   forming a TaON layer on the SiON film; and
   forming an upper electrode on the TaON layer.

* * * * *